United States Patent
Kothandaraman et al.

(10) Patent No.: US 8,629,049 B2
(45) Date of Patent: Jan. 14, 2014

(54) ELECTRICALLY PROGRAMMABLE FUSE USING ANISOMETRIC CONTACTS AND FABRICATION METHOD

(75) Inventors: Chandrasekharan Kothandaraman, Hopewell Junction, NY (US); Dan Moy, Bethel, CT (US); Norman W. Robson, Hopewell Junction, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/420,724

(22) Filed: Mar. 15, 2012

(65) Prior Publication Data

US 2012/0171857 A1  Jul. 5, 2012

Related U.S. Application Data

(62) Division of application No. 12/493,616, filed on Jun. 29, 2009, now Pat. No. 8,519,507.

(51) Int. Cl.
*H01L 21/44* (2006.01)
(52) U.S. Cl.
USPC ........... 438/601; 438/132; 438/215; 438/281; 438/333; 257/529; 257/E21.592
(58) Field of Classification Search
USPC .......... 438/601, 132, 215, 281, 333; 257/529, 257/E21.592
See application file for complete search history.

(56) References Cited

U.S. PATENT DOCUMENTS

| | | | |
|---|---|---|---|
| 6,624,499 B2 | 9/2003 | Kothandaraman et al. |
| 7,378,718 B2 | 5/2008 | Tsutsui |
| 2007/0222027 A1 | 9/2007 | Yang et al. |
| 2007/0222028 A1 | 9/2007 | Matsuoka et al. |
| 2008/0211059 A1 | 9/2008 | Kwon et al. |

FOREIGN PATENT DOCUMENTS

| | | |
|---|---|---|
| CN | 1674273 A | 9/2005 |
| CN | 1716591 A | 1/2006 |
| CN | 101061584 A | 10/2007 |
| CN | 101174607 A | 5/2008 |
| CN | 101295703 A | 10/2008 |
| CN | 101300677 A | 11/2008 |

OTHER PUBLICATIONS

Information Materials for IDS Report dated Dec. 27, 2012, Prepared by: Xiao Qi Zhi; SIPO Office Action dated Dec. 25, 2012.

*Primary Examiner* — Timor Karimy
(74) *Attorney, Agent, or Firm* — Cantor Colburn LLP; Yuanmin Cai

(57) ABSTRACT

A fabrication method for fabricating an electrically programmable fuse method includes depositing a polysilicon layer on a substrate, patterning an anode contact region, a cathode contact region and a fuse link conductively connecting the cathode contact region with the anode contact region, which is programmable by applying a programming current, depositing a silicide layer on the polysilicon layer, and forming a plurality of anisometric contacts on the silicide layer of the cathode contact region and the anode contact region in a predetermined configuration, respectively.

7 Claims, 10 Drawing Sheets

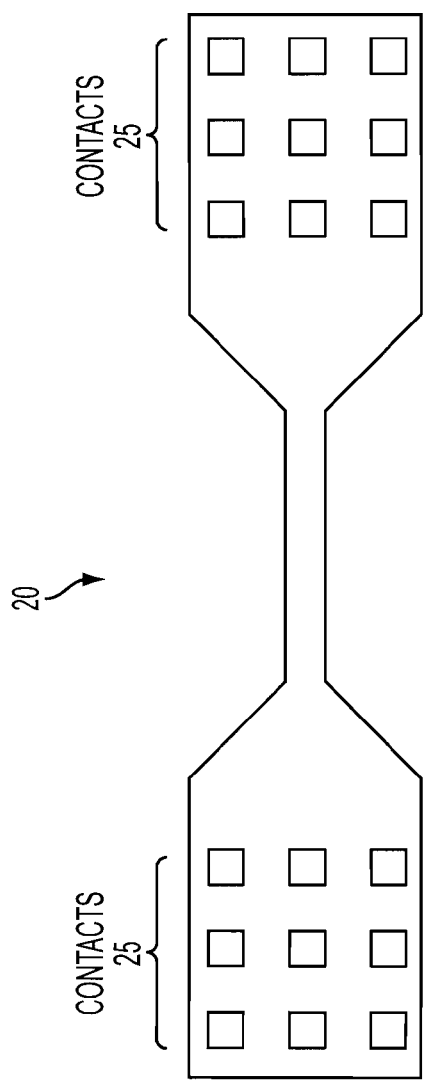
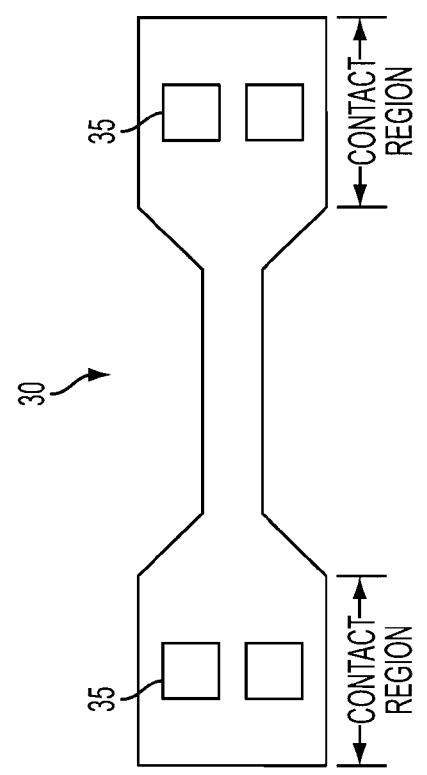
FIG. 1A PRIOR ART
FIG. 1B PRIOR ART

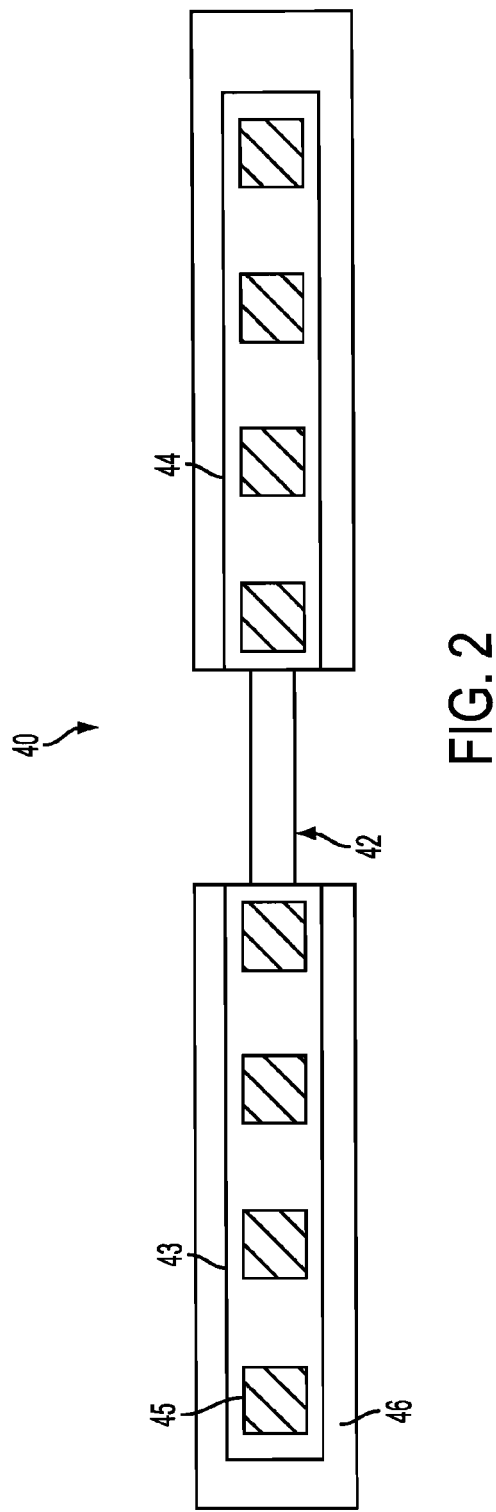

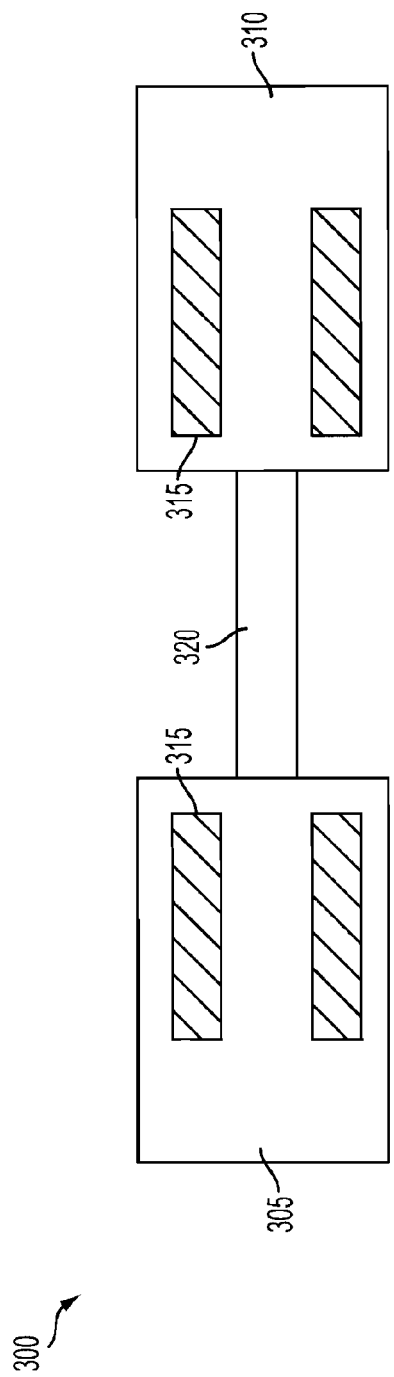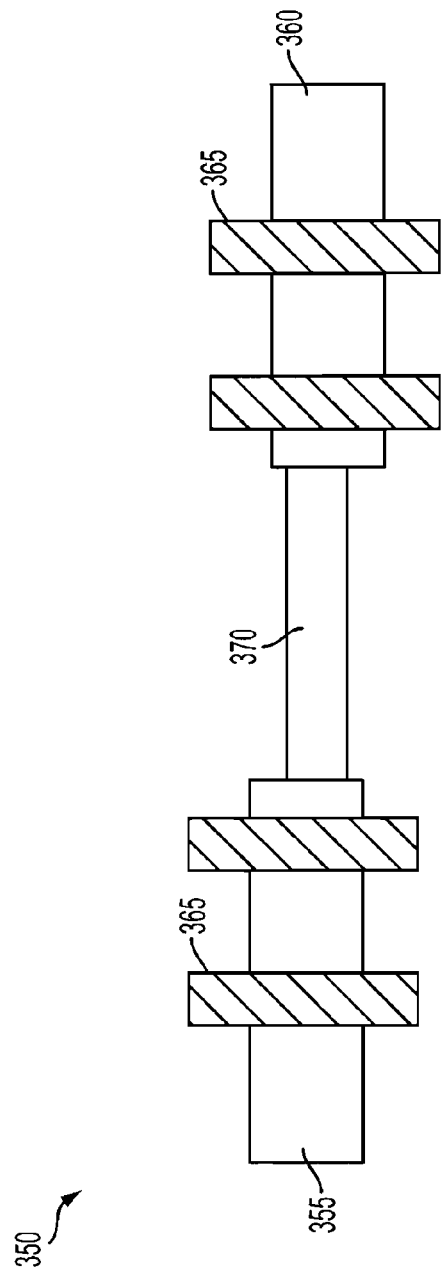

ELECTRICALLY PROGRAMMABLE FUSE USING ANISOMETRIC CONTACTS AND FABRICATION METHOD

CROSS REFERENCE TO RELATED APPLICATIONS

This is a divisional application of application Ser. No. 12/493,616, filed Jun. 29, 2009, now U.S. Pat. No. 8,519,507, the disclosure of which is incorporated by reference herein in its entirety.

BACKGROUND

This invention relates to electrically programmable fuses, and more particularly to an electrically programmable fuse including anisometric contacts and a fabrication method thereof.

Electrically programmable fuses have been employed in many advanced technologies within the semiconductor industry. These fuses are utilized for various integrated circuit applications such as an implementation of array redundancy, field programmable arrays, and in chip-ID, and analog trimming circuits. These fuses may be programmed to store data on an integrated circuit, to adjust components on the circuit or to program logic on the circuit, for example. In a typical electrically programmable fuse the contacts are symmetrically positioned for easier printing and optimization of contact processing. The term symmetric refers to the number of contacts and the shape of the contacts being primarily squares (i.e., symmetric). Conventional fuses also typically have a large landing region for the contacts, several times the actual fuse link width.

There are several problems associated with the contacts in the conventional fuses. For example, during electromigration, when a programming current is applied, instead of heat generation being confined to the middle of the fuse link, the contacts can also raise in temperature thereby causing degradation of the contact which may cause the fuse to fail to remain in the programmed state. If a large symmetric contact is used, while solving the contact degradation issue, the thermal mass of the system increases, thereby requiring very large programming current. The large contact landing region of the conventional fuse also contributes thermal mass, requiring high programming current and increasing the risk of contact degradation.

SUMMARY

In an exemplary embodiment, a fabrication method for fabricating an electrically programmable fuse method includes depositing a polysilicon layer on a substrate, patterning an anode contact region, a cathode contact region and a fuse link conductively connecting the cathode contact region with the anode contact region, which is programmable by applying a programming current, depositing a silicide layer on the polysilicon layer, and forming a plurality of anisometric contacts on the silicide layer of the cathode contact region and the anode contact region in a predetermined configuration, respectively.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1A and 1B are top views of conventional electrically programmable fuses.

FIG. 2 is a top view of an electrically programmable fuse having narrow contact regions that can be implemented within embodiments of the present invention.

FIGS. 4A and 4B are top views of electrically programmable fuses that can be implemented within alternative embodiments of the present invention.

Figure 3A:
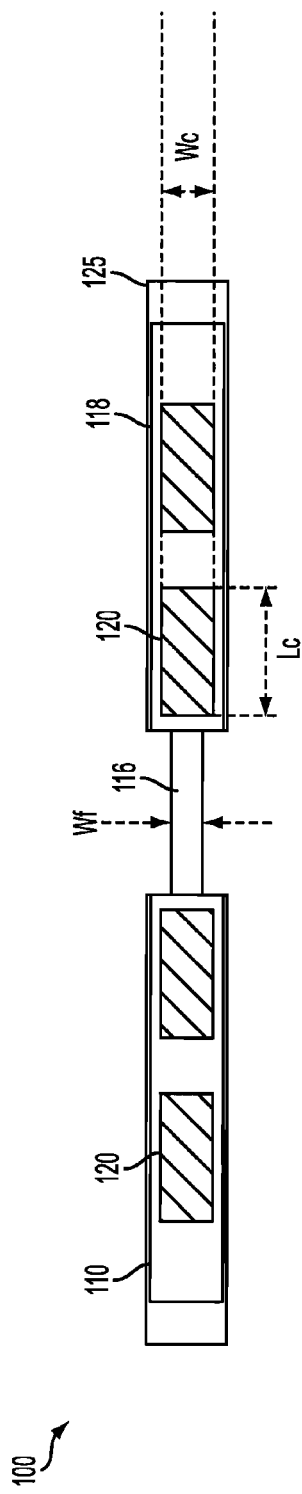
FIGS. 3A and 3B are top and side views, respectively, of an electrically programmable fuse that can be implemented within embodiments of the present invention.

The detailed description explains the preferred embodiments of the invention, together with advantages and features, by way of example with reference to the drawings.

DETAILED DESCRIPTION

Turning now to the drawings in greater detail, it will be seen that FIGS. 1A and 1B illustrate conventional electrically programmable fuses 20 and 30, respectively. In FIG. 1A, the conventional electrically programmable fuse 20 includes an array of symmetric contacts 25 positioned in a 3×3 arrangement, and in FIG. 1B, the conventional electrically programmable fuse 30 includes an array of symmetric contacts 35 positioned in a 2×1 arrangement. As can be seen in FIGS. 1A and 1B, the contact regions for which the contacts 25 and 35 are respectively formed are of a large area for contact processing. One problem associated with the conventional electrically programmable fuse is the possible degradation of the contacts during electromigration, when the programming current is applied to the fuse and heat is applied to the contacts.

To eliminate some of the problems such as contact degradation, associated with conventional electrically programmable fuses in FIGS. 1A and 1B, an electrically programmable fuse 40 having narrow contact regions is provided in FIG. 2 according to an embodiment of the present invention. The electrically programmable fuse 40 includes a fuse link 42, an anode contact region 43, and a cathode contact region 44 where the fuse link 42 conductively connects the cathode contact region 44 with the anode contact region 43, and is programmable by applying a programming current. According to an embodiment of the present invention, the anode and cathode contact regions 43 and 44 are narrower than that shown in FIGS. 1A and 1B. The narrower contact regions 43 and 44 reduce the thermal mass of the system, thereby reducing the current necessary to program the fuse. Symmetric contacts 45 are formed on each of the anode and cathode contact regions 43 and 44 in a 1×4 arrangement. The size of the contacts 45 in the current flow direction is equal to the size of the contacts in the direction perpendicular to the current flow direction. The present invention is not limited to any particular number of contacts or shape of the contacts as discussed below with reference to FIG. 3A through 5. In addition, a metal layer 46 is formed over the contacts 45 and acts as a heat sink for the anode and cathode contact regions 43 and 44. The metal layer 46 is isolated from the fuse link 42.

In FIG. 3A there is an electrically programmable fuse 100 according to a preferred embodiment of the present invention. The electrically programmable fuse 100 includes an anode contact region 110, a cathode contact region 118, and a fuse link 116 conductively connecting the cathode contact region 118 with the anode contact region 110. The fuse link 116 is programmable by applying a programming current. The electrically programmable fuse 100 includes a plurality of anisometric contacts 120 positioned on the anode and cathode contact regions 110 and 118, respectively. According to the preferred embodiment of the present invention, "anisometric" refers to the dimension of the contact in the one direction being unequal to the dimension of the contact 120 in the other direction (e.g., width of the contact 120 is not equal to the length of the contact 120). A metal layer 125 contacts the anode and cathode contact regions 110 and 118. As further shown in FIG. 3A, Wf represents the width of the fuse link 116 and Lc represents the longer dimension of each contact 120 and Wc represents the smaller dimension of each contact 120. According to the preferred embodiment of the present invention, Wf<Wc<3Wf and 2<Lc/Wc<10. The contact length Lc is larger than the contact width Wc. The distance between the contacts 120 is larger than the contact width Wc. According to the preferred embodiment of the present invention, Wf equals the nominal gate length in a given technology and may range from approximately 22 nm to approximately 350 nm. For example, for given technology node, if Wf=45 nm, then Wc ranges from approximately 60 nm to 135 nm and Lc ranges from approximately 120 nm to 300 nm). As shown in FIG. 3A, according to the preferred embodiment of the present invention, the anisometric contacts 120 include a pair of anisometric contacts aligned in a side-by-side arrangement such as a 1×2 arrangement on the anode and cathode contact regions 110 and 118, respectively. According to an embodiment of the present invention, the width of the anode and cathode contact regions 110 and 118 is less than a length of each anisometric contact 120 in a current flow direction of the electrically programmable fuse 100. According to another embodiment, the contacts 120 may be aligned orthogonal to the anode and cathode contact regions 110 and 118 (as depicted in FIG. 4B, for example). The present invention is not limited to any particular arrangement and number of contacts, and may vary accordingly. Alternative embodiments of the arrangement of the anisometric contacts will be discussed below with reference to FIGS. 4A and 4B. Since the fuse 100 includes anisometric contacts 120, upon applying the programming current to the fuse, the anisometric contacts 120 are not heated as much as comparably sized symmetric contacts. As opposed to the case of symmetric contacts, the anisometric contacts place the bulk of the thermal mass farther away from the fuse link 116 resulting in a lower temperature at the contact interface, thereby preventing the disruption of the liner materials in the contacts 120 and the degradation of the contact regions 110 and 118. Such degradations typically result in the diffusion of copper into the fuse link 116 causing a failure of the fuse 100.

Figure 3B:
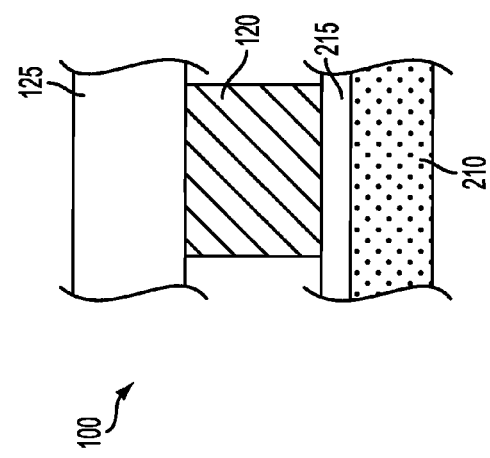

As shown in FIG. 3B, according to an embodiment of the present invention, the electrically programmable fuse 100 is formed by forming a polysilicon layer 210 on a substrate, and forming a silicide layer 215 on top of the polysilicon layer 210. The anisometric contacts 120 are formed thereon on the silicide layer 215 and the metal layer 125 contacts the contact 120. Additional details concerning a fabrication method for forming the electrically programmable fuse 100 will be discussed below with reference to FIG. 7A through 10B.

Figure 5:
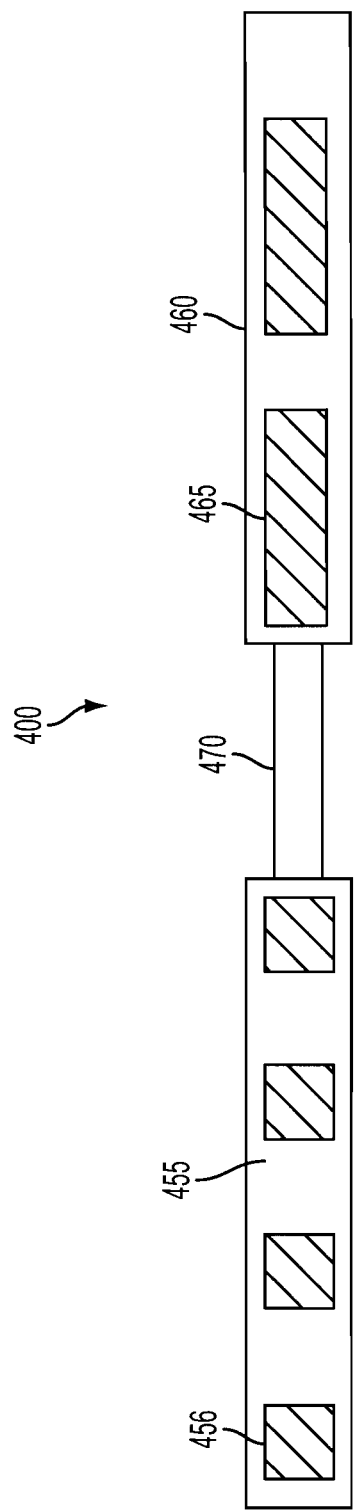
FIG. 5 is a top view of an electrically programmable fuse that can be implemented within alternative embodiments of the present invention.

As mentioned above, the present invention is not limited to the configuration shown in FIGS. 3A and 3B, alternative embodiments of the configuration will now be described with reference to FIGS. 4A, 4B and 5. As shown in FIG. 4A, an electrically programmable fuse 300 includes an anode contact region 305, a cathode contact region 310, multiple anisometric contacts 315 and a fuse link 320. As shown in this embodiment, the contacts 315 are positioned adjacent to each other in a 2×1 arrangement and the anode and cathode contact regions 305 and 310 are increased in width in comparison to those shown in FIG. 3A. Thus, according to one embodiment of the present invention, the contacts 315 may be in a n×1 arrangement where n is greater than 1. FIG. 4B illustrates an electrically programmable fuse 350 according to yet another embodiment of the present invention. As shown in FIG. 4B, the electrically programmable fuse 350 includes an anode contact region 355, a cathode contact region 360, multiple anisometric contacts 365 and a fuse link 370. In the current embodiment, the contacts 365 are positioned in a vertical direction (i.e., orthogonal to the anode and cathode contact regions 355 and 360). The anode and cathode contact regions 355 and 360 are of a same size as those shown in FIG. 3A. FIG. 5 illustrates an electrically programmable fuse 400 according to yet another embodiment of the present invention. As shown in FIG. 4, the electrically programmable fuse 400 includes an anode contact region 455, a cathode contact region 460, multiple anisometric contacts 465 only on the cathode contact region 460 and symmetric contacts 456 on the anode contact region 455, and a fuse link 470. The purpose of forming anisometric contacts 465 only on the cathode contact region 460 is that the degradation of contacts during electromigration typically occurs at the cathode of the fuse. According to one embodiment of the present invention, the anisometric contacts 465 are formed orthogonal to the cathode contact region 460. The present invention is not limited to any particular number of anisometric contacts and may vary accordingly.

Figure 6:
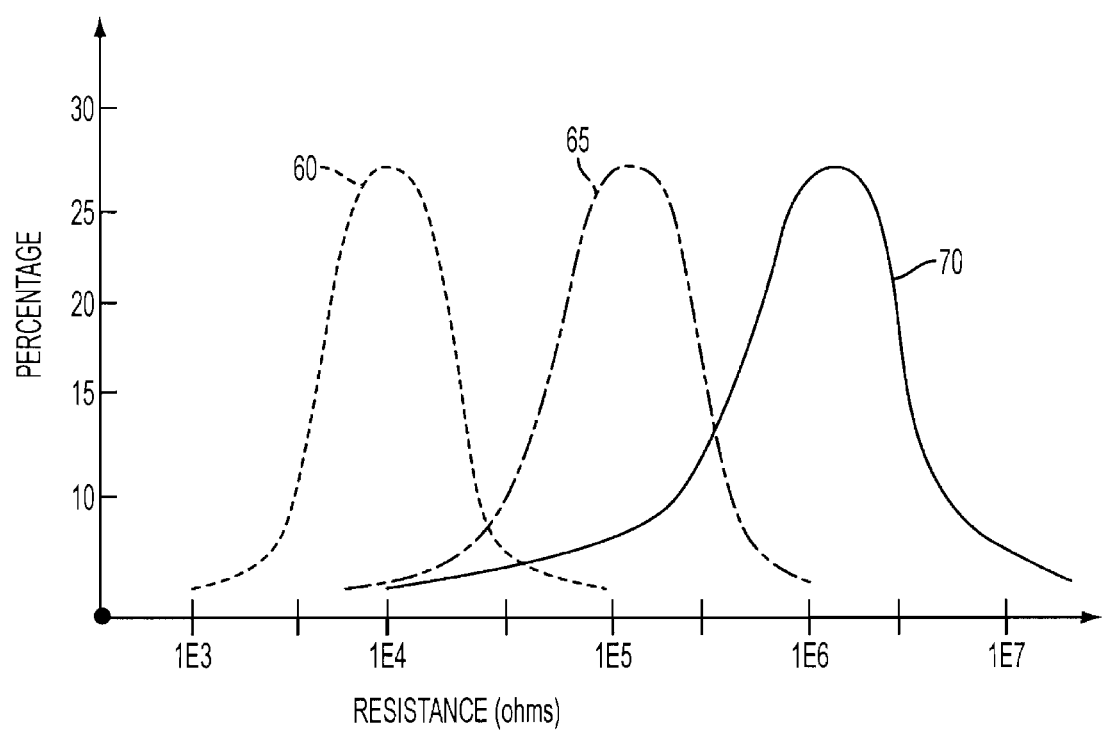
FIG. 6 is a bell shape curve which illustrates a distribution of programmed resistance of a conventional electrically programmable fuse vs. an electrically programmable fuse having narrow contact regions and an electrically programmable fuse according to an embodiment of the present invention.

FIG. 6 is a bell shape curve which illustrates a distribution of programmed resistance of a conventional electrically programmable fuse (as indicated by the reference numeral 60) vs. an electrically programmable fuse having narrow contact regions (as indicated by reference numeral 65) and an electrically programmable fuse according to an embodiment of the present invention (as indicated by reference numeral 70). As shown in FIG. 6, the distribution of the electrically programmable fuse of the present invention produces a higher median resistance and a tighter distribution which enables better sensing performance. Typically the conventional electrically programmable fuse having symmetric contacts results in a median programmed resistance of $1 \times 10^4$ ohms (as indicated by reference numeral 60) and having tail fuses in the distribution coming as low as $1 \times 10^3$ ohms. The electrically programmable fuse having narrow contact regions has a slightly higher median resistance of greater than $1 \times 10^5$ ohms (as indicated by reference numeral 65) and having tail fuses in the distribution coming below $1 \times 10^4$ ohms. On the other hand, the electrically programmable fuse having the anisometric contacts according to an embodiment of the present invention, has a higher median resistance (as indicated by reference numeral 70), greater than approximately $1 \times 10^6$ ohms and rarely having tail fuses with resistances below $1 \times 10^4$ ohms thereby enabling the sensing circuit to work with a wide margin of operation.

FIG. 7A through 10B are top views and side views, respectively, illustrating a fabrication method of an electrically programmable fuse that can be implemented within embodiments of the present invention. The fabrication method for fabricating the electrically programmable fuse 100 shown in FIG. 3A, for example, will now be described below.

Figure 7A:
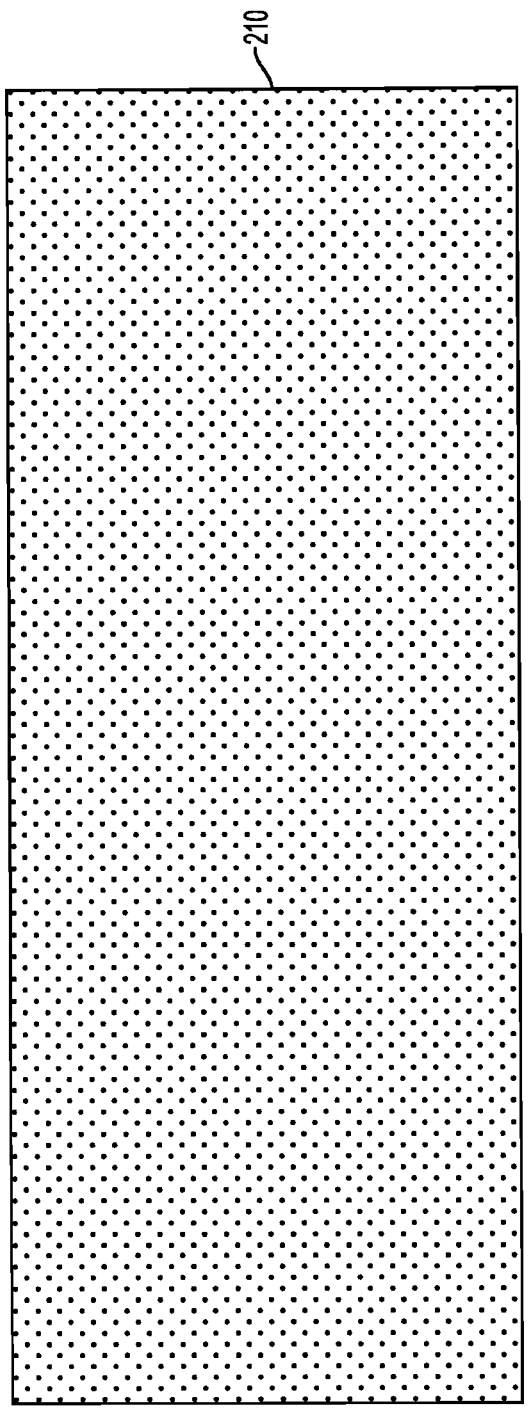
FIG. 7A through 10B are top views and side views, respectively, illustrating various operations of a fabrication method of an electrically programmable fuse that can be implemented within embodiments of the present invention.
Figure 7B:
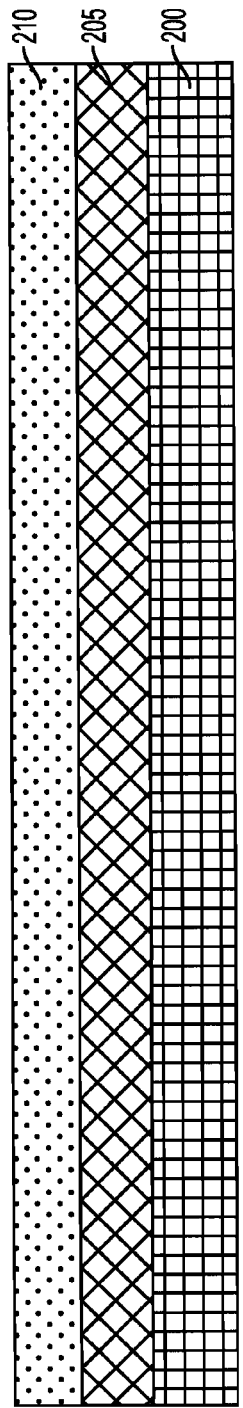
Figure 8A:
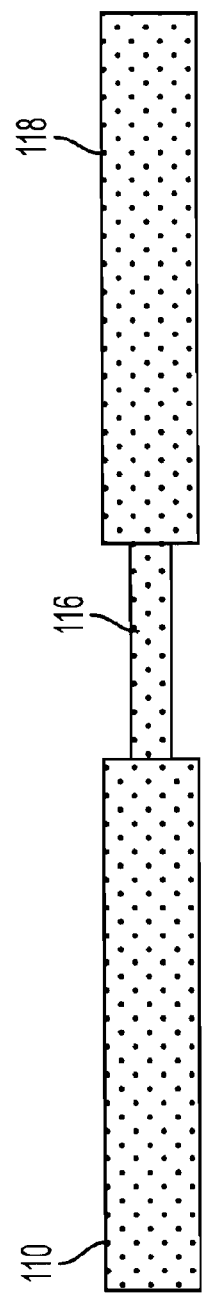
Figure 8B:
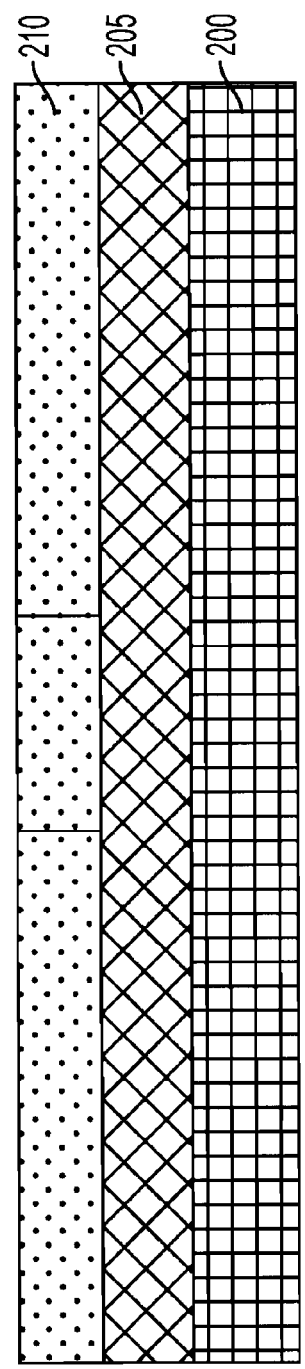

In FIGS. 7A and 7B, a silicon substrate 200 is provided and a shallow trench isolation (STI) 205 is formed over the silicon substrate 200. A polysilicon layer 210 is then deposited over STI 205. Next, in FIGS. 8A and 8B, the anode contact region 110, the cathode contact region 118 and the fuse link 116 are formed via a lithographic patterning process. However, the present invention is not limited hereto and any suitable process may be used.

Figure 9A:
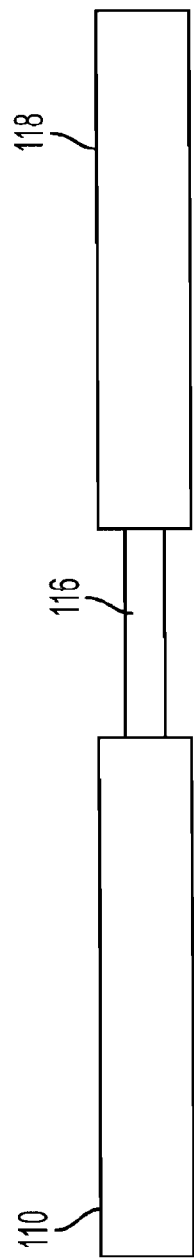
Figure 9B:
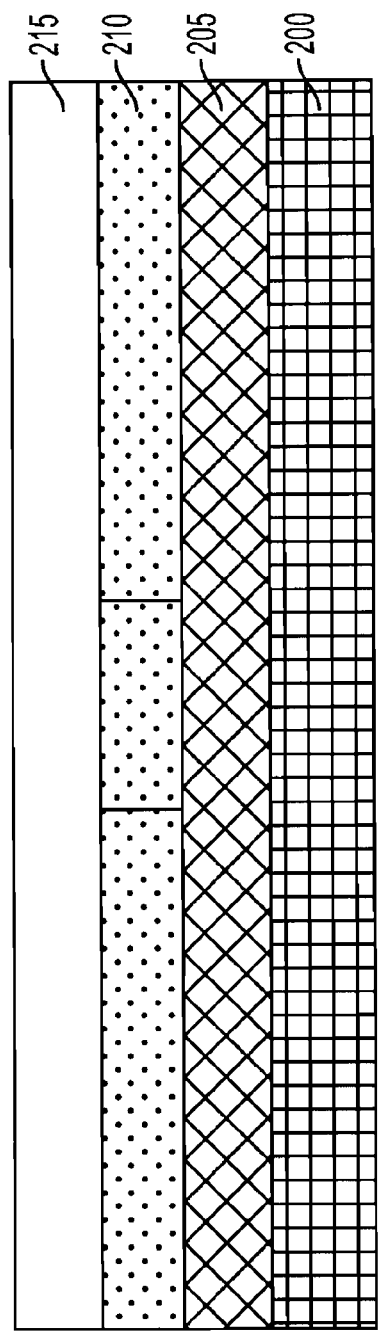

In FIGS. 9A and 9B, a silicide layer 215 is then deposited over the polysilicon layer 210 on the anode contact region 110, the cathode contact region 118 and the fuse link 116.

Figure 10A:
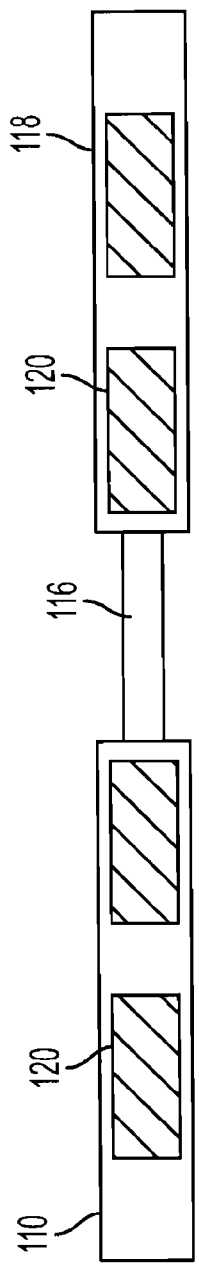
Figure 10B:
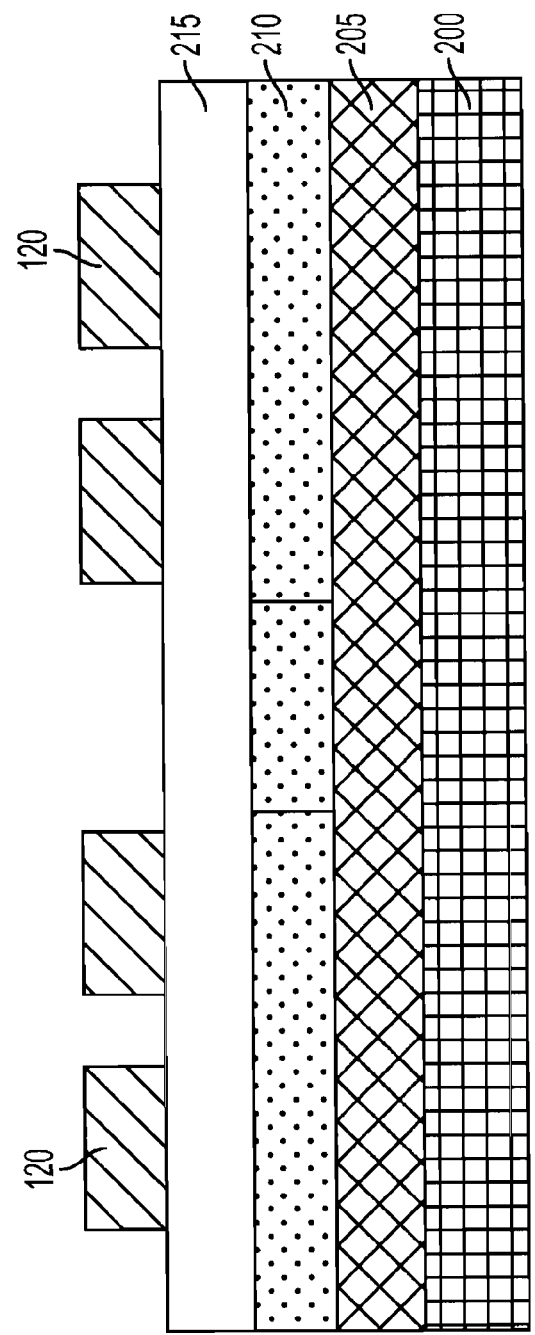

Then, as shown in FIGS. 10A and 10B, a plurality of anisometric contacts 120 are formed on the silicide layer 215 of the anode contact region 110 and the cathode contact region 118 in a predetermined configuration, respectively.

The present invention provides anisometric contacts which enables sufficient contact area without enlarging the fuse. Therefore, the present invention provides no increase in the contact pad size, thereby preserving high density, improved reliability and improved programmability. That is, the improved thermal characteristics of the anisometric contacts also have an advantage in that they enable longer programming times and higher programming currents; this enables higher post-programming resistance and thus enables simpler and more robust sensing circuitry While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A fabrication method of an electrically programmable fuse, the method comprising:
    depositing a polysilicon layer on a substrate;
    patterning an anode contact region, a cathode contact region and a fuse link conductively connecting the cathode contact region with the anode contact region, which is programmable by applying a programming current;
    depositing a silicide layer on the polysilicon layer; and
    forming a plurality of anisometric contacts on the silicide layer of the cathode contact region and the anode contact region in a predetermined configuration, respectively, wherein a width of the anode and cathode contact regions is less than a length of each anisometric contact in a longitudinal direction of the electrically programmable fuse, and wherein the width of the anode and cathode contact regions refers to a dimension perpendicular to the longitudinal direction and also parallel to a plane of the substrate.

2. The fabrication method of claim 1, wherein forming the plurality of anisometric contacts comprises:
    forming the anisometric contacts in a side-by-side arrangement.

3. The fabrication method of claim 1, wherein forming the plurality of anisometric contacts comprises:
    forming the anisometric contacts orthogonal to the anode and cathode contact regions.

4. The fabrication method of claim 2, wherein the plurality of anisometric contacts includes a pair of anisometric contacts formed on the anode contact region and the cathode contact region, respectively.

5. The fabrication method of claim 1, wherein forming the plurality of anisometric contacts comprises:
    forming the anisometric contacts in a n×1 arrangement where n is greater than 1.

6. The fabrication method of claim 1, wherein a width of the fuse link is less than the width of each anisometric contact, and the width of each anisometric contact is less than three times the width of the fuse link.

7. The fabrication method of claim 1, wherein the anisometric contacts are dimensioned in accordance with the following expressions:

$$Wf < Wc < 3Wf; \text{and}$$

$$2 < Lc/Wc < 10;$$

wherein Wf represents a width of the fuse link, Lc represents a contact length of the anisometric contacts in the longitudinal direction of the electrically programmable fuse, and Wc represents a contact width of the anisometric contacts.

* * * * *